(12) United States Patent
Hickle (10) Patent No.: US 11,158,941 B2
(45) Date of Patent: Oct. 26, 2021

(54) DECORRELATION OF INTERMODULATION PRODUCTS IN MIXER CIRCUITS

(71) Applicant: BAE Systems Information and Electronic Systems Integration Inc., Nashua, NH (US)

(72) Inventor: Mark D. Hickle, Merrimack, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 238 days.

(21) Appl. No.: 16/673,228

(22) Filed: Nov. 4, 2019

(65) Prior Publication Data
US 2021/0135356 A1    May 6, 2021

(51) Int. Cl.
| | |
|---|---|
| *H01Q 3/28* | (2006.01) |
| *H01Q 21/06* | (2006.01) |
| *H03D 7/12* | (2006.01) |

(52) U.S. Cl.
CPC ............... *H01Q 3/28* (2013.01); *H01Q 21/06* (2013.01); *H03D 7/125* (2013.01)

(58) Field of Classification Search
None
See application file for complete search history.

(56) References Cited

U.S. PATENT DOCUMENTS

| | | | | |
|---|---|---|---|---|
| 2005/0088248 A1* | 4/2005 | White | ..................... | H05H 3/04 |
| | | | | 331/94.1 |
| 2009/0323864 A1* | 12/2009 | Tired | ..................... | H04B 1/30 |
| | | | | 375/319 |
| 2014/0176224 A1* | 6/2014 | Winiecki | ............. | H03D 7/1441 |
| | | | | 327/355 |

OTHER PUBLICATIONS

Talisa, S.H. et al., "Benefits of Digital Phased Array Radars", in Proceedings of the IEEE, Mar. 2016, vol. 104, pp. 530-543.
Razavi B., "The Bootstrapped Switch [A Circuit for All Seasons]", in IEEE Solid-State Circuits Magazine, 2015, pp. 12-15.

\* cited by examiner

*Primary Examiner* — Whitney Moore
(74) *Attorney, Agent, or Firm* — Finch & Maloney PLLC (57) ABSTRACT

Techniques are provided for decorrelation of intermodulation products in mixer circuits. A circuit implementing the techniques according to an embodiment includes four switches. Each of the switches comprise a complementary pair of n-channel and p-channel metal oxide semiconductor (NMOS/PMOS) field effect transistors (FETs). The NMOS/PMOS FETs include a source port, a drain port, and a gate port. The gate port is configured to receive an oscillator signal. The circuit also includes electrical conductors to couple the four switches into a double-balanced passive ring configuration to generate an output signal as a mix of an input signal and the oscillator signal. The output signal includes a third order intermodulation (IM3) product. The circuit further includes a voltage bias generator to generate a bias voltage to bias the input signal and the output signal. The magnitude and phase of the IM3 product are determined, at least in part, by the bias voltage.

20 Claims, 8 Drawing Sheets

DECORRELATION OF INTERMODULATION PRODUCTS IN MIXER CIRCUITS

STATEMENT OF GOVERNMENT INTEREST

This invention was made with United States Government assistance under Contract No. 18-C-8668, awarded by the United States Government. The United States Government has certain rights in this invention.

FIELD OF DISCLOSURE

The present disclosure relates to mixer circuits, and more particularly, to decorrelation of intermodulation products in mixer circuits.

BACKGROUND

Many types of signal processing systems, including communication systems, radars, and electronic warfare systems, to name a few, benefit from the use of analog components that exhibit highly linear characteristics. Such characteristics enable these systems to provide increased sensitivity and dynamic range. High linearity is typically achieved by increasing direct current (DC) power consumption. This is undesirable, however, as any increase in DC power consumption tends to increase cost and complexity of the system. Additionally, in some applications, it is impractical or impossible to provide those increased power levels.

Although the following Detailed Description will proceed with reference being made to illustrative embodiments, many alternatives, modifications, and variations thereof will be apparent to those skilled in the art.

DETAILED DESCRIPTION

As noted previously, linearity is a desired characteristic in the analog components of many types of signal processing systems, as this can provide increased sensitivity and dynamic range. Improved linearity can often be achieved at the expense of increased DC power consumption. This is generally an undesirable trade-off, however, as power consumption is usually a critical system parameter that needs to be minimized in most applications. Thus, an alternative technique for increasing the linearity of a system is needed.

To this end, mixer circuits are disclosed which provide the capability to randomize the amplitude and phase of undesired nonlinearities of the mixer output. In an embodiment, this randomization of amplitude and phase is implemented through variation of a bias voltage, without adversely affecting the desired linear component of the mixer output. The undesired nonlinearities are referred to herein as third order intermodulation (IM3) products and the desired linear component is referred to as the fundamental term. This randomization of the IM3 amplitude and phase allows for at least partial decorrelation between the nonlinear output products of two or more mixers. Thus, according to one such embodiment of the present disclosure, an array of mixers may be provided in which the mixer outputs are summed, as in a digital beamforming application, for example. In such an array, employing the disclosed mixer circuits, the undesired IM3 products add together incoherently and tend to cancel one another out or otherwise mitigate the effects of such products, which improves the aggregate linearity of the system, without requiring an increase in power of the analog components.

The disclosed techniques can be used in a wide variety of applications including, for example, communication systems, radars, and electronic warfare systems. In accordance with an embodiment, a mixer circuit to implement these techniques includes four switches. Each of the switches comprise a complementary pair of NMOS/PMOS FETs (n-type and p-type metal oxide semiconductor field effect transistors). The NMOS/PMOS FETs each include a source port, a drain port, and a gate port. The mixer circuit also includes electrical conductors to couple the four switches into a double-balanced passive ring configuration, as will be explained in greater detail below. The mixer circuit is configured to generate an output signal as a mix of an input signal and an oscillator signal to achieve frequency up-conversion or down-conversion of the input signal. The mixer circuit is further configured to receive the oscillator signal through the gate ports of the FETs of the switches, and to receive the input signal and supply the output signal through the source and drain ports of the FETs of the switches. The output signal thus generated includes a third order intermodulation (IM3) product, which is characterized by a magnitude and a phase. The mixer circuit further includes a voltage bias generator to generate a bias voltage to bias the input signal and the output signal. The magnitude and the phase of the IM3 product are determined, at least in part, by the bias voltage, which can be randomly varied for each mixer circuit, resulting in decorrelation of the nonlinear components of the output between each mixer, and a reduction in the nonlinearity of the summation of the outputs of the mixers.

It will be appreciated that the techniques described herein may provide an improved method for increasing linearity, compared to other possible techniques, such as those that rely on increased DC power. Numerous embodiments and applications will be apparent in light of this disclosure.

Figure 1:
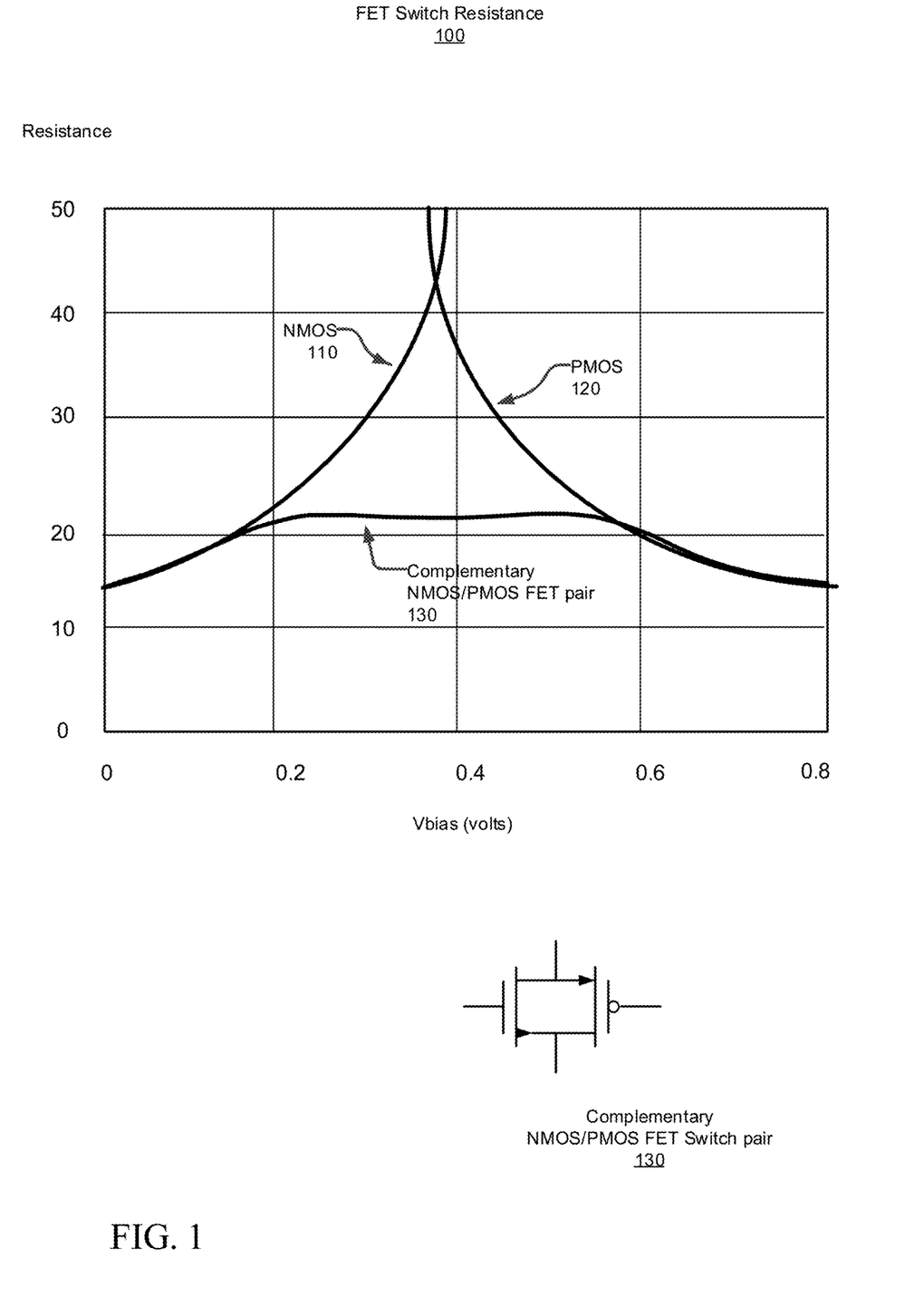
FIG. 1 is a plot of the switch resistance of field effect transistor (FET) configurations, in accordance with certain embodiments of the present disclosure.

FIG. 1 is a plot 100 of the switch resistance of FET configurations, in accordance with certain embodiments of the present disclosure. The plot illustrates the on-state resistance (in ohms) versus gate to source/drain bias voltage (in volts) for three FET switch configurations: an NMOS FET 110, a PMOS FET 120, and a complementary NMOS/PMOS FET pair 130. An example circuit diagram for the complementary NMOS/PMOS FET pair 130 is also shown.

As can be seen, the NMOS FET 110 on-state resistance increases monotonically with increasing bias voltage while the PMOS FET 120 on-state resistance decreases monotonically with increasing bias voltage.

The on-state resistance of the complementary NMOS/PMOS FET switch 130, however, changes non-monotonically over the voltage range. In particular the resistance (in this example) increases for bias voltages below approximately 0.2 volts, remains relatively constant over the range of approximately 0.2 to 0.6 volts, and then decreases for bias voltages above approximately 0.6 volts. Variation in switch resistance with applied bias voltage leads to distortion of the input signal. As a result, the properties of intermodulation distortion products generated by the switch 130 (or a mixer circuit utilizing the switch) can be modified by operating the switch at different bias voltages.

Figure 2:
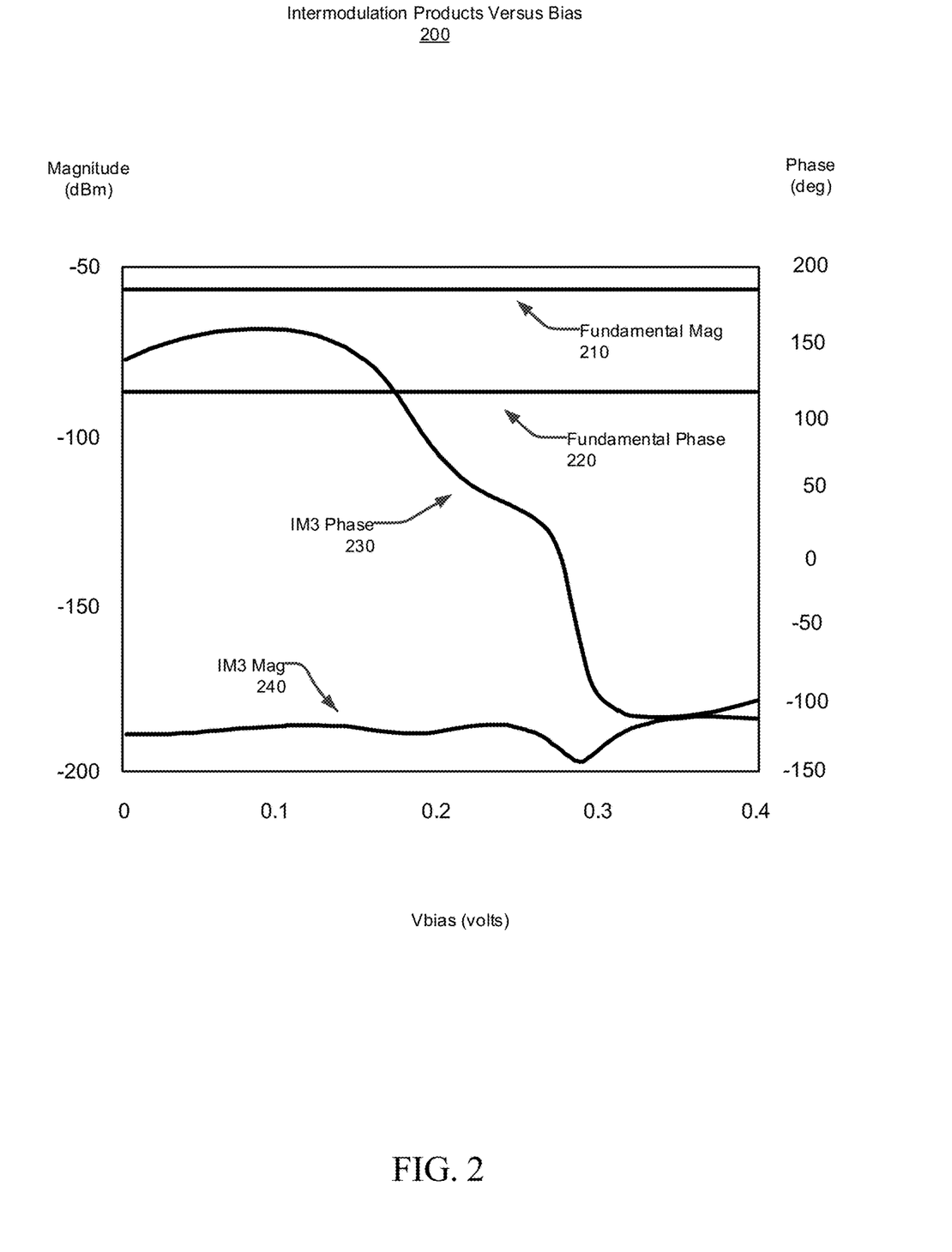
FIG. 2 is a plot of the intermodulation products versus bias voltage of a FET mixer, configured in accordance with certain embodiments of the present disclosure.

FIG. 2 is a plot 200 of the intermodulation products versus bias voltage of a FET mixer, configured in accordance with certain embodiments of the present disclosure. Plot 200 illustrates how both the magnitude and phase of the third order intermodulation (IM3) products change as the bias voltage of the mixer circuit (e.g., shown in FIG. 3) is varied. As can be seen, the IM3 phase 230 undergoes a phase shift of more than 250 degrees, as the bias voltage is varied from 0.1 to 0.3 volts. The IM3 magnitude 240 also varies to some degree over this range. The magnitude 210 and phase 220 of the desired fundamental signal components, however, remain relatively constant and so are largely unaffected by the change in bias voltage.

Figure 3:
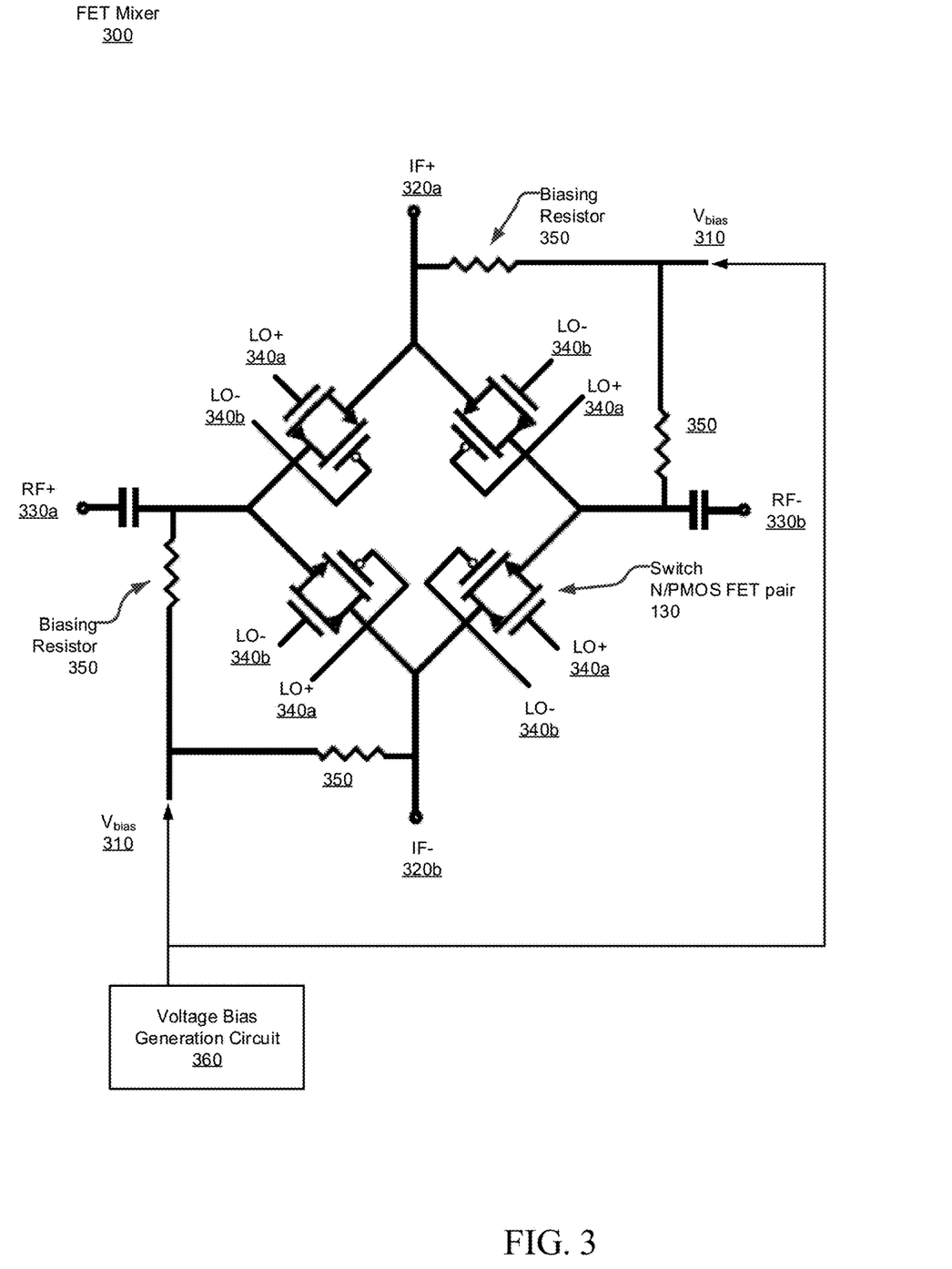
FIG. 3 illustrates a FET mixer circuit, configured in accordance with certain embodiments of the present disclosure.

FIG. 3 illustrates a FET mixer circuit 300, configured in accordance with certain embodiments of the present disclosure. The FET mixer circuit 300 is shown to be a double-balanced passive FET ring mixer, in which the switching elements are realized by complementary NMOS/PMOS FETs 130. A local oscillator LO signal 340 is applied to the gate ports of the FET pairs 130. In some embodiments, the input signal is an intermediate frequency (IF) signal 320, and the output signal is a radio frequency (RF) signal 330, which is generated through frequency up-conversion of the IF signal, by mixing the LO signal with the IF signal. In some embodiments, the input signal is a radio frequency (RF) signal 330, and the output signal is an intermediate frequency (IF) signal 320, which is generated through frequency down-conversion of the RF signal, by mixing of the LO signal with the RF signal. The inputs and outputs (IF and RF, or RF and IF) of the mixer circuit are biased to a DC voltage $V_{bias}$ 310 through relatively high-valued biasing resistors 350.

In some embodiments, the LO, IF, and RF signals are differential signals as shown in this example mixer circuit 300, and labeled LO+ 340a, LO− 340b, IF+ 320a, IF− 320b, RF+ 330a, and RF− 330b.

Voltage bias generation circuit 360 is configured to generate a random or pseudo-randomly selected bias voltage 310 for application to the inputs and outputs of the mixer circuit 300 through biasing resistors 350. Thus, in applications that employ multiple mixer circuits, each mixer circuit will likely be biased by a different voltage, resulting in variations of the generated IM3 amplitudes and phases (non-linearities) between mixer circuits. As a result, the IM3 non-linearities will be relatively de-correlated between mixer circuits and sum incoherently, resulting in improved linearity.

In some embodiments, the random value selection process for the bias voltage provides a uniform probability distribution over a selected voltage range (e.g., between 0.0 volts and the maximum power supply voltage of the NMOS/PMOS FETs 130, also referred to as $VDD_{MAX}$). Said differently, each mixer circuit will be provided with a bias voltage that is randomly selected from within that voltage range with an equal probability. In some embodiments, the bias voltage may vary over time, according to a randomly selected pattern that is heuristically determined to produce a relatively optimum decorrelation of IM3 non-linearities between mixers.

In general, $VDD_{MAX}$ is the maximum power supply voltage associated with the process technology used to fabricate the NMOS/PMOS FETs 130. The following table provides some example values for CMOS technology (other technologies, such as Gallium Arsenide, would be associated with different values):

| Process technology | $VDD_{MAX}$ (Typical) |
| --- | --- |
| 14 nm Silicon CMOS | 0.8 V |
| 22 nm Silicon CMOS | 0.8 V |
| 28 nm Silicon CMOS | 0.9 V |
| 45 nm Silicon CMOS | 1.0 V |
| 65 nm Silicon CMOS | 1.2 V |
| 90 nm Silicon CMOS | 1.2 V |
| 130 nm Silicon CMOS | 1.5 V |
| 180 nm Silicon CMOS | 1.8 V |

Figure 4:
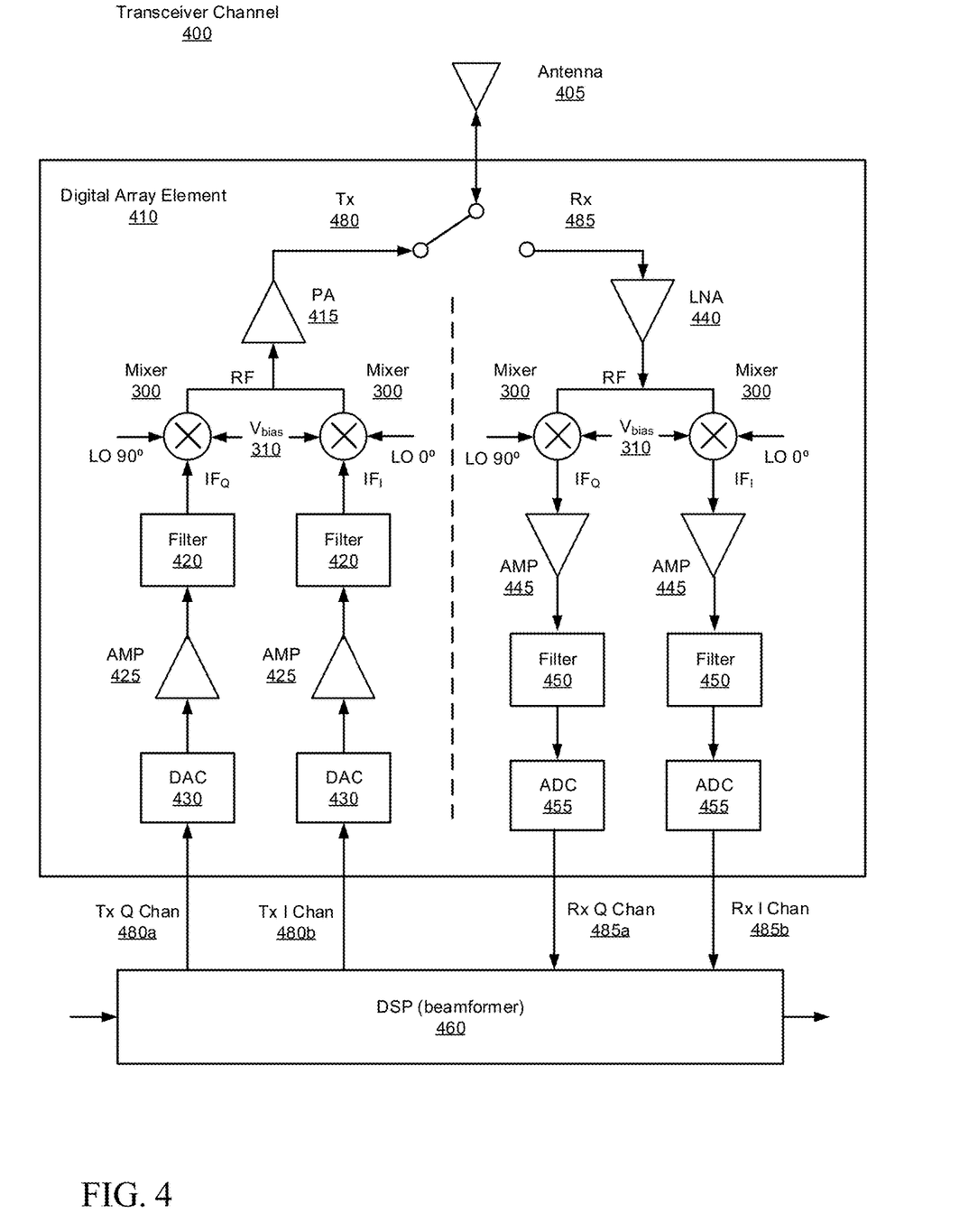
FIG. 4 is a block diagram of a digital array element of a transceiver channel, configured in accordance with certain embodiments of the present disclosure.

FIG. 4 is a block diagram of a digital array element 410 of a transceiver channel 400, configured in accordance with certain embodiments of the present disclosure. In some embodiments, the digital array element 410 is one element of an array of elements, for example a beamforming array, as will be described in greater detail below. The transceiver channel 400 is shown to include an antenna 405, a digital array element 410, and a processor 460. In some embodiments, the processor may be a digital signal processor, configured to perform beamforming operations.

The digital array element 410 is shown to include a transmission (Tx) channel 480, and a receiver (Rx) channel 485. In some embodiments, the transmission channel 480 may further comprise an in-phase sub-channel Tx I 480b and a quadrature-phase sub-channel Tx Q 480a. In some such embodiments, the receiver channel 485 may further comprise in-phase sub-channel Rx I 485b and quadrature-phase sub-channel Rx Q 485a.

The transmission channels Tx Q 480a and Tx I 480b are shown to each include a digital to analog converter (DAC) 430, an amplifier 425, a filter 420, mixer circuit 300, and a power amplifier (PA) 415.

DACs 430 are configured to convert the digital signals supplied by the DSP 460 to analog signals. Amplifiers 425 are configured to amplify the analog signals to a desired amplitude, and filters 420 are configured to filter the amplified analog signals to a desired frequency range, thus generating the transmission IF signals $IF_Q$ and $IF_I$. Mixer circuits 300 are configured to frequency up-convert the IF signals to RF signals by mixing the IF signals with an LO signal. The LO signal is phase shifted by 90° on the Q sub-channel. Mixer circuits 300 are further supplied with a bias voltage 310, to affect the IM3 component of the generated RF signals, as previously described. The resulting RF signals on the I sub-channel and the Q sub-channel are summed and fed to PA 415 for transmission through antenna 405, during time periods when the antenna 405 is switched to the transmit channel 480.

The receiver channels Rx Q 485a and Rx I 485b are shown to each include an analog to digital converter (ADC) 455, a filter 450, an amplifier 445, mixer circuit 300, and a low noise amplifier (LNA) 440.

During time periods when the antenna 405 is switched to the receiver channel 485, a received RF signal is fed to the LNAs 440 for amplification and then provided to mixer circuits 300 on the I sub-channel 485b and the Q sub-channel 485a. Mixer circuits 300 are configured to frequency down-convert the RF signals to IF signals $IF_Q$ and $IF_I$, by mixing the RF signals with an LO signal. The LO signal is phase shifted by 90° on the Q sub-channel. Mixer circuits 300 are further supplied with a bias voltage 310, to affect the IM3 component of the generated IF signals, as previously described. Amplifiers 445 are configured to amplify the analog IF signals to a desired amplitude, and filters 450 are configured to filter the amplified analog signals to a desired frequency range. ADC 455 is configured to convert the amplified and filtered analog IF signals to digital I and Q signals to be supplied to the DSP 460.

Figure 5:
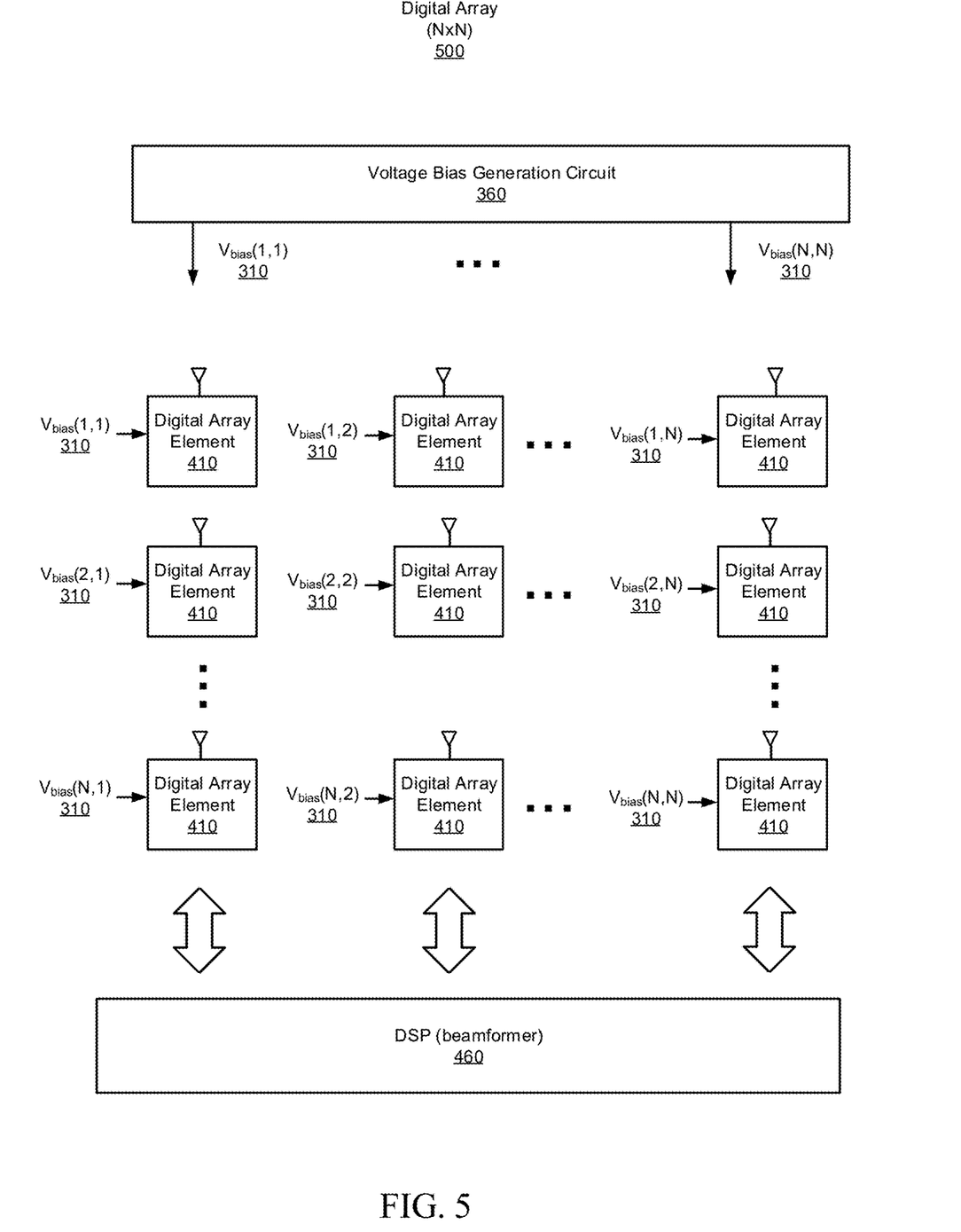
FIG. 5 is a block diagram of a digital array, configured in accordance with certain embodiments of the present disclosure.

FIG. 5 is a block diagram of a digital array 500, configured in accordance with certain embodiments of the present disclosure. The digital array 500 is shown to comprise a number of digital array elements which, in this example, are arranged in an N×N array. In some embodiments, the digital array may include hundreds or even thousands of elements. The elements 410 are shown to communicate with the DSP 460 which is configured to perform beamforming, using any suitable techniques in light of the present disclosure. It will be appreciated, however, that many other multichannel applications are possible, which can take advantage of the linearity improving features of the disclosed mixer circuit 300. Such applications may include communication systems, radars, and electronic warfare systems to name just a few.

Voltage bias generation circuit 360 is configured to provide bias voltages 310 to each of the digital array elements 410. Each digital array element 410 may be provided with a relatively unique randomly selected bias voltage (e.g., $V_{bias}(1,1)$, $V_{bias}(1,2)$, ... $V_{bias}(N,N)$), such that the inputs and/or outputs of the elements 410 include IM3 products that are random in amplitude and phase and thus uncorrelated with the IM3 products of the inputs/outputs of the other elements. These undesired distortion products (IM3 products) will then add incoherently across the array, resulting in a higher dynamic range after the digital beamforming process.

As described previously, each of the randomly selected bias voltages may be associated with a uniform probability distribution over a selected voltage range which depends on the properties of the NMOS/PMOS FET pairs of the mixer 300. In some embodiments, the voltage range may be from 0.0 volts to $VDD_{MAX}$. In some embodiments, the voltage bias generation circuit 360 may be configured to provide time-varying bias voltages to each of the elements 410. The time-varying bias voltages are also within the selected voltage range (e.g., 0.0 volts to $VDD_{MAX}$) and exhibit a uniform probability distribution over that range over time. In still other embodiments, the selected bias voltages may be associated with other suitable probability distribution functions.

In some embodiments, the bias voltages applied to each element 410 may be preselected, to provide the optimal decorrelation, based on experimental data or other heuristic techniques. For example, simulations can be run on the array using different sets of bias voltages, and linearity measurements can be performed to determine an optimal set of bias voltages.

Figure 6:
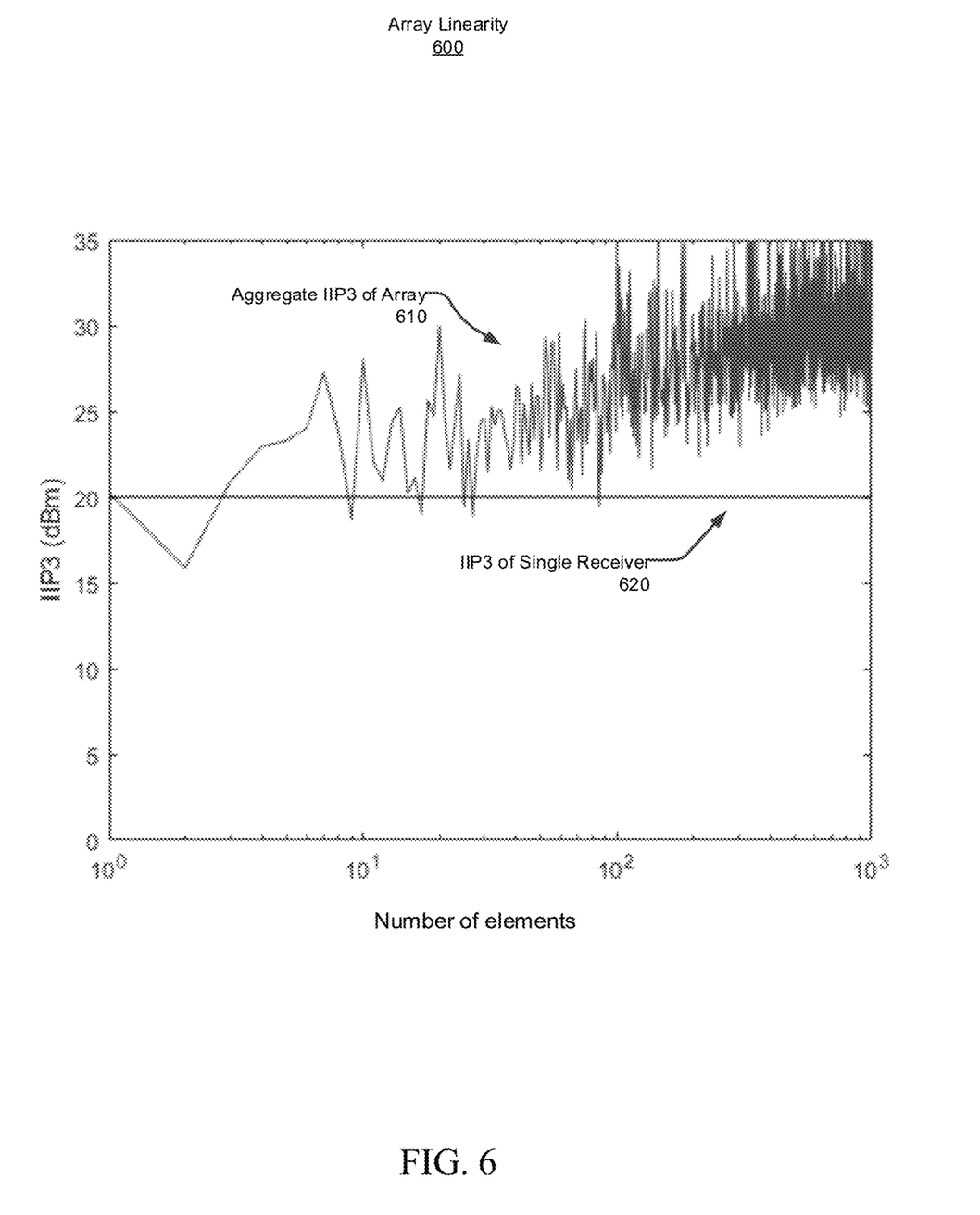
FIG. 6 is a plot of array linearity versus number of elements, in accordance with certain embodiments of the present disclosure.

FIG. 6 is a plot 600 of array linearity versus number of elements, in accordance with certain embodiments of the present disclosure. The linearity of an array is expressed, for this plot, as a third order input intercept point (IIP3), which is a standard metric for quantifying the linearity of the system. As can be seen, the IIP3 before a single receiver 620 remains constant at approximately 20 dBm. In contrast, the aggregate IIP3 of the array 610 is shown to improve with a general upward trend from 20 dBm to approximately 30 dBm, as the number of elements increases from one to 1000. The jitter in this plot results from the fact that one set of randomly generated bias voltages may produce better decorrelation than another set of randomly generated bias voltages. Thus, while the trend is upward, the linearity for 99 elements may be better than the linearity for 100 elements, depending on the particular bias voltages used. Varying the bias voltages over time may smooth out the jitter in this plot.

Methodology

Figure 7:
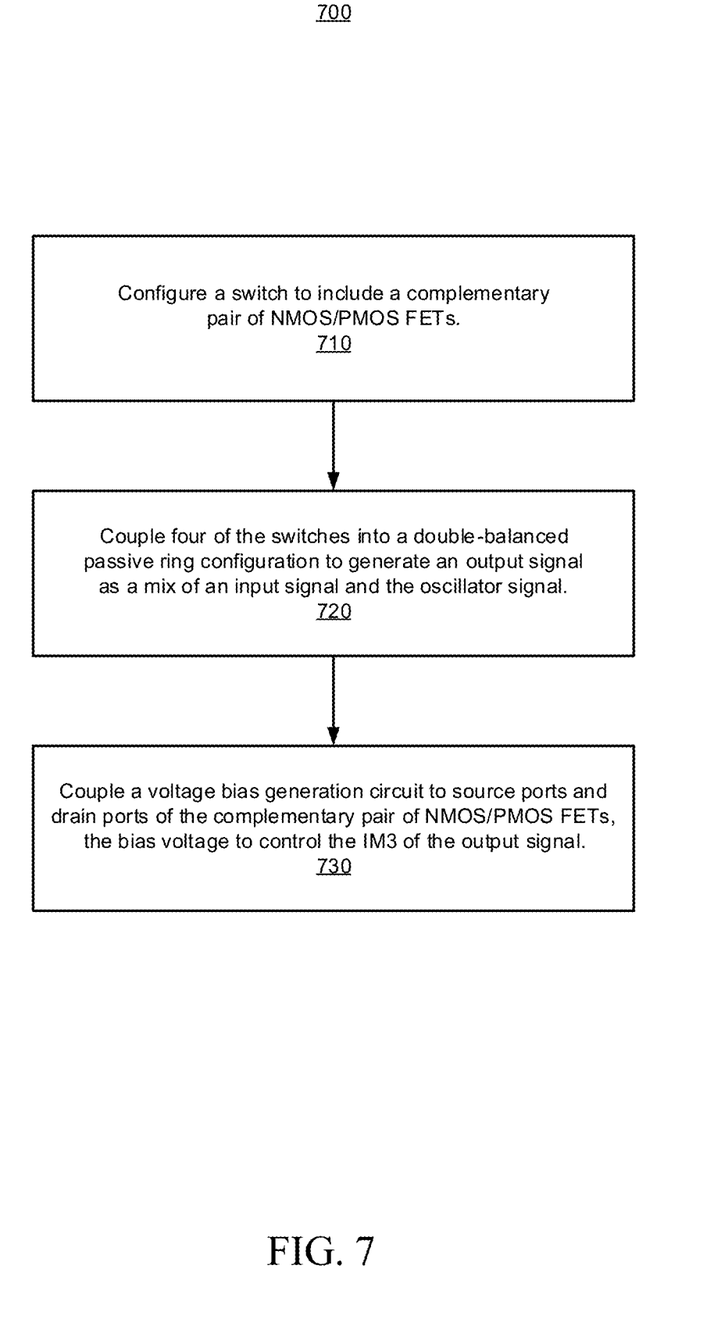
FIG. 7 is a flowchart illustrating a methodology for fabrication of a mixer circuit, in accordance with an embodiment of the present disclosure.

FIG. 7 is a flowchart illustrating a methodology for fabrication of a mixer circuit, in accordance with an embodiment of the present disclosure. As can be seen, example method 700 includes a number of phases and sub-processes, the sequence of which may vary from one embodiment to another. However, when considered in aggregate, these phases and sub-processes form a fabrication process for a mixer circuit, in accordance with certain of the embodiments disclosed herein. These embodiments can be implemented, for example using the system architecture illustrated in FIGS. 2, 4, and 5, as described above. However other system architectures can be used in other embodiments, as will be apparent in light of this disclosure. To this end, the correlation of the various functions shown in FIG. 7 to the specific components illustrated in FIGS. 2, 4, and 5 is not intended to imply any structural and/or use limitations. Rather other embodiments may include, for example, varying degrees of integration wherein multiple functionalities are effectively performed by one system. Numerous variations and alternative configurations will be apparent in light of this disclosure.

As illustrated in FIG. 7, in one embodiment method 700 commences, at operation 710, by configuring a switch to include a complementary pair of NMOS/PMOS FETs. The NMOS/PMOS FETs each include a source port, a drain port, and a gate port.

Next, at operation 720, the mixer is fabricated by coupling four of the switches into a double-balanced passive ring configuration. The mixer is configured to generate an output signal as a mix of an input signal and an oscillator signal. The mixer is configured to receive the oscillator signal through the gates of the FETs of the switches, and to receive the input signal and supply the output signal through the sources and drains of the FETs of the switches, as previously described. The output signal includes a third order intermodulation (IM3) product, which is characterized by a magnitude and a phase.

At operation 730, a voltage bias generation circuit is coupled to the source ports and the drain ports of the complementary pairs of NMOS/PMOS FETs of the switches. The voltage bias generation circuit is configured to generate a bias voltage to bias the input signal and the output signal such that the magnitude and the phase of the IM3 product are determined or modified by the bias voltage.

Of course, in some embodiments, additional operations may be performed, as previously described in connection with the system. These additional operations may include, for example, configuring the voltage bias generation circuit to generate the bias voltage in a voltage range of 0.0 volts to $VDD_{MAX}$. In some embodiments, the generated bias voltage is selected within the voltage range based on a random value selection process. The random value selection process may provide a uniform probability distribution over the voltage range. In some embodiments, the generated bias voltage may be time varying, within the voltage range.

Example Platforms

Figure 8:
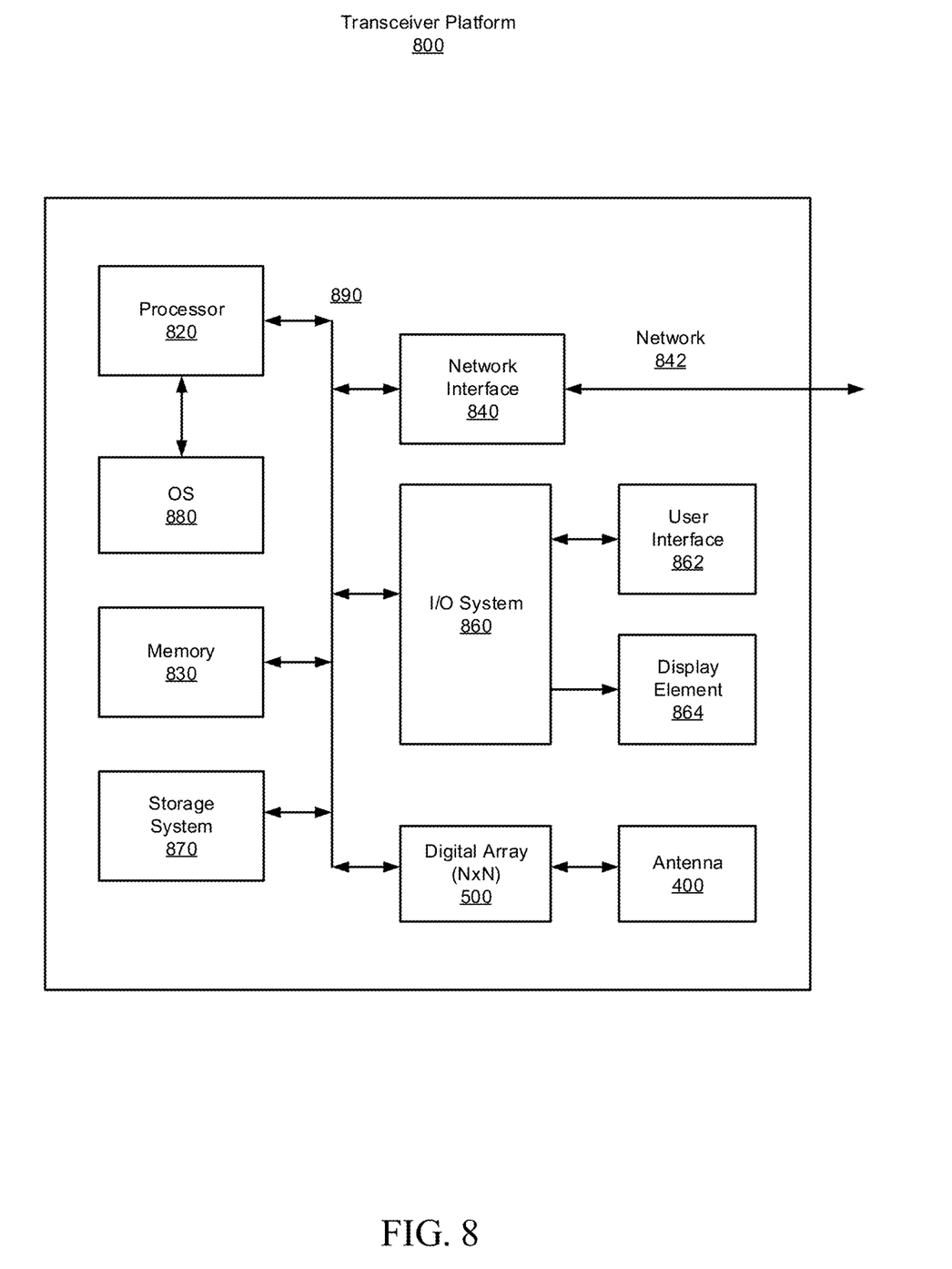
FIG. 8 is a block diagram schematically illustrating a transceiver platform employing a digital array using the disclosed mixer circuits, in accordance with certain embodiments of the present disclosure.

FIG. 8 is a block diagram schematically illustrating a transceiver platform 800 employing a digital array 500 using the disclosed mixer circuits 200, in accordance with certain embodiments of the present disclosure. In some embodiments, transceiver platform 800 may be hosted on, or otherwise be incorporated into, a radio, electronic warfare system, microwave backhaul system, data communication device, personal computer, workstation, laptop computer, tablet, portable computer, and so forth. Any combination of different devices may be used in certain embodiments.

In some embodiments, transceiver platform 800 may comprise any combination of a processor 820, a memory 830, an input/output (I/O) system 860, a user interface 862, a display element 864, a storage system 870, a network interface 840, digital array 500, and antenna 400. As can be further seen, a bus and/or interconnect 890 is also provided to allow for communication between the various components listed above and/or other components not shown. Platform 800 can be coupled to a network 842 through network interface 840 to allow for communications with other computing devices, platforms, devices to be controlled, or other resources. Other componentry and functionality not reflected in the block diagram of FIG. 8 will be apparent in light of this disclosure, and it will be appreciated that other embodiments are not limited to any particular hardware configuration.

Processor 820 can be any suitable processor, and may include one or more coprocessors or controllers, such as an audio processor, a graphics processing unit, or hardware accelerator, to assist in control and processing operations associated with platform 800. In some embodiments, the processor 820 may be implemented as any number of processor cores. The processor (or processor cores) may be any type of processor, such as, for example, a microprocessor, an embedded processor, a digital signal processor (DSP), a graphics processor (GPU), a network processor, a field programmable gate array or other device configured to execute code. The processors may be multithreaded cores in that they may include more than one hardware thread context (or "logical processor") per core. Processor 820 may be implemented as a complex instruction set computer (CISC) or a reduced instruction set computer (RISC) processor.

Memory 830 can be implemented using any suitable type of digital storage including, for example, flash memory and/or random-access memory (RAM). In some embodiments, the memory 830 may include various layers of memory hierarchy and/or memory caches as are known to those of skill in the art. Memory 830 may be implemented as a volatile memory device such as, but not limited to, a RAM, dynamic RAM (DRAM), or static RAM (SRAM) device. Storage system 870 may be implemented as a non-volatile storage device such as, but not limited to, one or more of a hard disk drive (HDD), a solid-state drive (SSD), a universal serial bus (USB) drive, an optical disk drive, tape drive, an internal storage device, an attached storage device, flash memory, battery backed-up synchronous DRAM (SDRAM), and/or a network accessible storage device.

Processor 820 may be configured to execute an Operating System (OS) 880 which may comprise any suitable operating system, such as Google Android (Google Inc., Mountain View, Calif.), Microsoft Windows (Microsoft Corp., Redmond, Wash.), Apple OS X (Apple Inc., Cupertino, Calif.), Linux, or a real-time operating system (RTOS). As will be appreciated in light of this disclosure, the techniques provided herein can be implemented without regard to the particular operating system provided in conjunction with platform 800, and therefore may also be implemented using any suitable existing or subsequently-developed platform.

Network interface circuit 840 can be any appropriate network chip or chipset which allows for wired and/or wireless connection between other components of device platform 800 and/or network 842, thereby enabling platform 800 to communicate with other local and/or remote computing systems, servers, cloud-based servers, and/or other resources. Wired communication may conform to existing (or yet to be developed) standards, such as, for example, Ethernet. Wireless communication may conform to existing (or yet to be developed) standards, such as, for example, cellular communications including LTE (Long Term Evolution), Wireless Fidelity (Wi-Fi), Bluetooth, and/or Near Field Communication (NFC). Exemplary wireless networks include, but are not limited to, wireless local area networks, wireless personal area networks, wireless metropolitan area networks, cellular networks, and satellite networks.

I/O system 860 may be configured to interface between various I/O devices and other components of platform 800. I/O devices may include, but not be limited to, user interface 862 and display element 864. User interface 862 may include other devices (not shown) such as a touchpad, keyboard, mouse, microphone and speaker, trackball or scratch pad, and camera. I/O system 860 may include a graphics subsystem configured to perform processing of images for rendering on the display element 864. Graphics subsystem may be a graphics processing unit or a visual processing unit (VPU), for example. An analog or digital interface may be used to communicatively couple graphics subsystem and the display element. For example, the interface may be any of a high definition multimedia interface (HDMI), DisplayPort, wireless HDMI, and/or any other suitable interface using wireless high definition compliant techniques. In some embodiments, the graphics subsystem could be integrated into processor 820 or any chipset of platform 800.

It will be appreciated that in some embodiments, some of the various components of platform 800 may be combined or integrated in a system-on-a-chip (SoC) architecture. In some embodiments, the components may be hardware components, firmware components, software components or any suitable combination of hardware, firmware or software.

Digital array 500 is configured to perform beamforming, on signals which may be transmitted and/or received through antenna 400, using the disclosed FET mixers 200, as described previously. Digital array 500 may include any or all of the components illustrated in FIGS. 2, 4, and 5 as described above. These components can be implemented or otherwise used in conjunction with a variety of suitable hardware that is coupled to or that otherwise forms a part of platform 800.

Various embodiments of platform 800 may be implemented using hardware elements, software elements, or a combination of both. Examples of hardware elements may include processors, microprocessors, circuits, circuit elements (for example, transistors, resistors, capacitors, inductors, and so forth), integrated circuits, ASICs, programmable logic devices, digital signal processors, FPGAs, logic gates, registers, semiconductor devices, chips, microchips, chipsets, and so forth. Examples of software may include software components, programs, applications, computer programs, application programs, system programs, machine programs, operating system software, middleware, firmware, software modules, routines, subroutines, functions, methods, procedures, software interfaces, application program interfaces, instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power level, heat tolerances, processing cycle budget, input data rates, output data rates, memory resources, data bus speeds, and other design or performance constraints.

The various embodiments disclosed herein can be implemented in various forms of hardware, software, firmware, and/or special purpose processors. For example, in one embodiment at least one non-transitory computer readable storage medium has instructions encoded thereon that, when executed by one or more processors, causes one or more of the methodologies disclosed herein to be implemented. Other componentry and functionality not reflected in the illustrations will be apparent in light of this disclosure, and it will be appreciated that other embodiments are not limited to any particular hardware or software configuration. Thus, in other embodiments platform 800 may comprise additional, fewer, or alternative subcomponents as compared to those included in the example embodiment of FIG. 8.

Some embodiments may be described using the expression "coupled" and "connected" along with their derivatives. These terms are not intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still cooperate or interact with each other.

The aforementioned non-transitory computer readable medium may be any suitable medium for storing digital information, such as a hard drive, a server, a flash memory, and/or random access memory (RAM), or a combination of memories. In alternative embodiments, the components and/or modules disclosed herein can be implemented with hardware, including gate level logic such as a field-programmable gate array (FPGA), or alternatively, a purpose-built semiconductor such as an application-specific integrated circuit (ASIC). In some embodiments, the hardware may be modeled or developed using hardware description languages such as, for example Verilog or VHDL. Still other embodiments may be implemented with a microcontroller having a number of input/output ports for receiving and outputting data, and a number of embedded routines for carrying out the various functionalities disclosed herein. It will be apparent that any suitable combination of hardware, software, and firmware can be used, and that other embodiments are not limited to any particular system architecture.

Some embodiments may be implemented, for example, using a machine readable medium or article which may store an instruction or a set of instructions that, if executed by a machine, may cause the machine to perform a method and/or operations in accordance with the embodiments. Such a machine may include, for example, any suitable processing platform, computing platform, computing device, processing device, computing system, processing system, computer, process, or the like, and may be implemented using any suitable combination of hardware and/or software. The machine readable medium or article may include, for example, any suitable type of memory unit, memory device, memory article, memory medium, storage device, storage article, storage medium, and/or storage unit, such as memory, removable or non-removable media, erasable or non-erasable media, writeable or rewriteable media, digital or analog media, hard disk, floppy disk, compact disk read only memory (CD-ROM), compact disk recordable (CD-R) memory, compact disk rewriteable (CD-RW) memory, optical disk, magnetic media, magneto-optical media, removable memory cards or disks, various types of digital versatile disk (DVD), a tape, a cassette, or the like. The instructions may include any suitable type of code, such as source code, compiled code, interpreted code, executable code, static code, dynamic code, encrypted code, and the like, implemented using any suitable high level, low level, object oriented, visual, compiled, and/or interpreted programming language.

Unless specifically stated otherwise, it may be appreciated that terms such as "processing," "computing," "calculating," "estimating," "determining," or the like refer to the action and/or process of a computer or computing system, or similar electronic computing device, that manipulates and/or transforms data represented as physical quantities (for example, electronic) within the registers and/or memory units of the computer system into other data similarly represented as physical quantities within the registers, memory units, or other such information storage transmission or displays of the computer system. The embodiments are not limited in this context.

The terms "circuit" or "circuitry," as used in any embodiment herein, are functional and may comprise, for example, singly or in any combination, hardwired circuitry, programmable circuitry such as computer processors comprising one or more individual instruction processing cores, state machine circuitry, and/or firmware that stores instructions executed by programmable circuitry. The circuitry may include a processor and/or controller configured to execute one or more instructions to perform one or more operations described herein. The instructions may be embodied as, for example, an application, software, firmware, or one or more embedded routines configured to cause the circuitry to perform any of the aforementioned operations. Software may be embodied as a software package, code, instructions, instruction sets and/or data recorded on a computer-readable storage device. Software may be embodied or implemented to include any number of processes, and processes, in turn, may be embodied or implemented to include any number of threads or parallel processes in a hierarchical fashion. Firmware may be embodied as code, instructions or instruction sets and/or data that are hard-coded (e.g., nonvolatile) in memory devices. The circuitry may, collectively or individually, be embodied as circuitry that forms part of a larger system, for example, an integrated circuit (IC), an application-specific integrated circuit (ASIC), a system-on-a-chip (SoC), computers, and other processor-based or functional systems. Other embodiments may be implemented as software executed by a programmable control device. In such cases, the terms "circuit" or "circuitry" are intended to include a combination of software and hardware such as a programmable control device or a processor capable of executing the software. As described herein, various embodiments may be implemented using hardware elements, software elements, or any combination thereof. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth.

Numerous specific details have been set forth herein to provide a thorough understanding of the embodiments. It will be understood by an ordinarily-skilled artisan, however, that the embodiments may be practiced without these specific details. In other instances, well known operations, components and circuits have not been described in detail so as not to obscure the embodiments. It can be appreciated that the specific structural and functional details disclosed herein may be representative and do not necessarily limit the scope of the embodiments. In addition, although the subject matter has been described in language specific to structural features and/or methodological acts, it is to be understood that the subject matter defined in the appended claims is not necessarily limited to the specific features or acts described herein. Rather, the specific features and acts described herein are disclosed as example forms of implementing the claims.

FURTHER EXAMPLE EMBODIMENTS

The following examples pertain to further embodiments, from which numerous permutations and configurations will be apparent.

One example embodiment of the present disclosure provides a mixer circuit comprising: four switches, wherein each of the switches comprises a complementary pair of n-channel and p-channel metal oxide semiconductor (NMOS/PMOS) field effect transistors (FETs), the NMOS/PMOS FETs each including a source port, a drain port, and a gate port, the respective gate ports to receive an oscillator signal; a plurality of electrical conductors to couple the four switches into a double-balanced passive ring configuration, the double-balanced passive ring configuration to generate an output signal as a mix of an input signal and the oscillator signal, wherein the output signal includes a third order intermodulation (IM3) product, the IM3 product characterized by a magnitude and a phase; and a voltage bias generation circuit to generate a bias voltage to bias the input signal and the output signal, wherein the magnitude and the phase of the IM3 product are modified by the bias voltage.

In some cases, the bias voltage is in a voltage range of 0.0 volts up to a maximum power supply voltage of the NMOS/PMOS FETs. In some such cases, the bias voltage is selected within the voltage range based on a random value selection process. In some such cases, the random value selection process provides a uniform probability distribution over the voltage range. In some such cases, the bias voltage is varied, within the voltage range, over time. In some cases, the bias voltage is applied to the source ports and the drain ports of the complementary pair of NMOS/PMOS FETs through biasing resistors. In some cases, the input signal, the output signal, and the oscillator signal are differential signals. In some cases, a communication or radar system includes the mixer circuit and the mixer circuit is configured to perform frequency conversion by mixing of the input signal with the oscillator signal to generate the output signal.

Another example embodiment of the present disclosure provides a beamforming system comprising: a first communication element comprising a first mixer circuit; a second communication element comprising a second mixer circuit, wherein the first mixer circuit and the second mixer circuit each comprise four switches coupled into a double-balanced passive ring configuration, each of the switches comprising a complementary pair of n-channel and p-channel metal oxide semiconductor field effect transistors, the switches of the first mixer circuit configured to generate a first output signal as a mix of a first input signal and a first oscillator signal, and the switches of the second mixer circuit configured to generate a second output signal as a mix of a second input signal and a second oscillator signal; and a voltage bias generation circuit to generate a first bias voltage to bias the first input and first output signals of the first mixer circuit, and to generate a second bias voltage to bias the second input and second output signals of the second mixer circuit, wherein a third order intermodulation (IM3) product of the first output signal is modified by the first bias voltage and an IM3 product of the second output signal is modified by the second bias voltage such that the IM3 product of the first output signal is uncorrelated with the IM3 product of the second output signal; wherein the first communication element is one of a transmitter, receiver, or transceiver, and the second communication element is one of a transmitter, receiver, or transceiver.

In some cases, the bias voltage is in a voltage range of 0.0 volts up to a maximum power supply voltage of the NMOS/PMOS FETs. In some such cases, the first bias voltage and the second bias voltage are each selected within the voltage range based on a random value selection process. In some such cases, the random value selection process provides a uniform probability distribution over the voltage range. In some such cases, the first bias voltage and the second bias voltage are varied, within the voltage, range over time. In some such cases, the first mixer is configured to perform at least one of frequency up-conversion by mixing of the first input signal at an intermediate frequency with the first oscillator signal to generate the first output signal at a radio frequency, and frequency down-conversion by mixing of the first input signal at a radio frequency with the first oscillator signal to generate the first output signal at an intermediate frequency; and the second mixer is configured to perform at least one of frequency up-conversion by mixing of the second input signal at an intermediate frequency with the second oscillator signal to generate the second output signal at a radio frequency, and frequency down-conversion by mixing of the second input signal at a radio frequency with the second oscillator signal to generate the second output signal at an intermediate frequency.

Another example embodiment of the present disclosure provides a method for fabricating a mixer circuit, the method comprising: configuring a switch to comprise a complementary pair of n-channel and p-channel metal oxide semiconductor (NMOS/PMOS) field effect transistors (FETs), the NMOS/PMOS FETs including a source port, a drain port, and a gate port, the gate port configured to receive an oscillator signal; coupling four of the switches into a double-balanced passive ring configuration to generate an output signal as a mix of an input signal and the oscillator signal, wherein the output signal includes a third order intermodulation (IM3) product, the IM3 product characterized by a magnitude and a phase; and coupling a voltage bias generation circuit to the source ports and the drain ports of the complementary pair of NMOS/PMOS FETs of the switches, the voltage bias generation circuit to generate a bias voltage to bias the input signal and the output signal, wherein the magnitude and the phase of the IM3 product are modified by the bias voltage.

In some cases, the method further comprises configuring the voltage bias generation circuit to generate the bias voltage in a voltage range of 0.0 volts up to a maximum power supply voltage of the NMOS/PMOS FETs. In some such cases, the generated bias voltage is selected within the voltage range based on a random value selection process. In some such cases, the random value selection process provides a uniform probability distribution over the voltage range. In some such cases, the generated bias voltage is varied, within the voltage range, over time. In some such cases, the method further comprises providing biasing resistors, wherein the bias voltage is applied to the source ports and the drain ports of the complementary pair of NMOS/PMOS FETs through the biasing resistors.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications. It is intended that the scope of the present disclosure be limited not by this detailed description, but rather by the claims appended hereto. Future filed applications claiming priority to this application may claim the disclosed subject matter in a different manner, and may generally include any set of one or more elements as variously disclosed or otherwise demonstrated herein.

What is claimed is:

1. A mixer circuit comprising:
   four switches, wherein each of the switches comprises a complementary pair of n-channel and p-channel metal oxide semiconductor (NMOS/PMOS) field effect transistors (FETs), the NMOS/PMOS FETs each including a source port, a drain port, and a gate port, the respective gate ports to receive an oscillator signal;
   a plurality of electrical conductors to couple the four switches into a double-balanced passive ring configuration, the double-balanced passive ring configuration to generate an output signal as a mix of an input signal and the oscillator signal, wherein the output signal includes a third order intermodulation (IM3) product, the IM3 product characterized by a magnitude and a phase; and
   a voltage bias generation circuit to generate a bias voltage to bias the input signal and the output signal, wherein the magnitude and the phase of the IM3 product are modified by the bias voltage.

2. The mixer circuit of claim 1, wherein the bias voltage is in a voltage range of 0.0 volts up to a maximum power supply voltage of the NMOS/PMOS FETs.

3. The mixer circuit of claim 2, wherein the bias voltage is selected within the voltage range based on a random value selection process.

4. The mixer circuit of claim 3, wherein the random value selection process provides a uniform probability distribution over the voltage range.

5. The mixer circuit of claim 2, wherein the bias voltage is varied, within the voltage range, over time.

6. The mixer circuit of claim 1, wherein the bias voltage is applied to the source ports and the drain ports of the complementary pair of NMOS/PMOS FETs through biasing resistors.

7. The mixer circuit of claim 1, wherein the input signal, the output signal, and the oscillator signal are differential signals.

8. A communication or radar system comprising the mixer circuit of claim 1, wherein the mixer circuit is configured to perform frequency conversion by mixing of the input signal with the oscillator signal to generate the output signal.

9. A beamforming system comprising:
   a first communication element comprising a first mixer circuit;
   a second communication element comprising a second mixer circuit, wherein the first mixer circuit and the second mixer circuit each comprise four switches coupled into a double-balanced passive ring configuration, each of the switches comprising a complementary pair of n-channel and p-channel metal oxide semiconductor field effect transistors, the switches of the first mixer circuit configured to generate a first output signal as a mix of a first input signal and a first oscillator signal, and the switches of the second mixer circuit configured to generate a second output signal as a mix of a second input signal and a second oscillator signal; and
   a voltage bias generation circuit to generate a first bias voltage to bias the first input and first output signals of the first mixer circuit, and to generate a second bias voltage to bias the second input and second output signals of the second mixer circuit, wherein a third order intermodulation (IM3) product of the first output signal is modified by the first bias voltage and an IM3 product of the second output signal is modified by the second bias voltage such that the IM3 product of the first output signal is uncorrelated with the IM3 product of the second output signal;
   wherein the first communication element is one of a transmitter, receiver, or transceiver, and the second communication element is one of a transmitter, receiver, or transceiver.

10. The beamforming system of claim 9, wherein the bias voltage is in a voltage range of 0.0 volts up to a maximum power supply voltage of the NMOS/PMOS FETs.

11. The beamforming system of claim 10, wherein the first bias voltage and the second bias voltage are each selected within the voltage range based on a random value selection process.

12. The beamforming system of claim 11, wherein the random value selection process provides a uniform probability distribution over the voltage range.

13. The beamforming system of claim 10, wherein the first bias voltage and the second bias voltage are varied, within the voltage, range over time.

14. The beamforming system of claim 10, wherein:
   the first mixer is configured to perform at least one of frequency up-conversion by mixing of the first input signal at an intermediate frequency with the first oscillator signal to generate the first output signal at a radio frequency, and frequency down-conversion by mixing of the first input signal at a radio frequency with the first oscillator signal to generate the first output signal at an intermediate frequency; and the second mixer is configured to perform at least one of frequency up-conversion by mixing of the second input signal at an intermediate frequency with the second oscillator signal to generate the second output signal at a radio frequency, and frequency down-conversion by mixing of the second input signal at a radio frequency with the second oscillator signal to generate the second output signal at an intermediate frequency.

15. A method for fabricating a mixer circuit, the method comprising:
configuring a switch to comprise a complementary pair of n-channel and p-channel metal oxide semiconductor (NMOS/PMOS) field effect transistors (FETs), the NMOS/PMOS FETs including a source port, a drain port, and a gate port, the gate port configured to receive an oscillator signal;
coupling four of the switches into a double-balanced passive ring configuration to generate an output signal as a mix of an input signal and the oscillator signal, wherein the output signal includes a third order intermodulation (IM3) product, the IM3 product characterized by a magnitude and a phase; and
coupling a voltage bias generation circuit to the source ports and the drain ports of the complementary pair of NMOS/PMOS FETs of the switches, the voltage bias generation circuit to generate a bias voltage to bias the input signal and the output signal, wherein the magnitude and the phase of the IM3 product are modified by the bias voltage.

16. The method of claim 15, further comprising configuring the voltage bias generation circuit to generate the bias voltage in a voltage range of 0.0 volts up to a maximum power supply voltage of the NMOS/PMOS FETs.

17. The method of claim 16, wherein the generated bias voltage is selected within the voltage range based on a random value selection process.

18. The method of claim 17, wherein the random value selection process provides a uniform probability distribution over the voltage range.

19. The method of claim 17, wherein the generated bias voltage is varied, within the voltage range, over time.

20. The method of claim 17, further comprising providing biasing resistors, wherein the bias voltage is applied to the source ports and the drain ports of the complementary pair of NMOS/PMOS FETs through the biasing resistors.

* * * * *